(12) United States Patent
Kim et al.

(10) Patent No.: US 11,417,284 B2
(45) Date of Patent: Aug. 16, 2022

(54) SENSING CIRCUIT AND DISPLAY APPARATUS HAVING THE SAME

(71) Applicant: SAMSUNG DISPLAY CO., LTD., Yongin-si (KR)

(72) Inventors: Sung Hwan Kim, Osan-si (KR); Wook Lee, Hwaseong-si (KR); Hayong Jung, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/467,502

(22) Filed: Sep. 7, 2021

(65) Prior Publication Data

US 2022/0076638 A1   Mar. 10, 2022

(30) Foreign Application Priority Data

Sep. 7, 2020   (KR) .................. 10-2020-0114151

(51) Int. Cl.
  *G09G 3/3291*   (2016.01)
  *H03M 1/36*   (2006.01)

(52) U.S. Cl.
  CPC ............ *G09G 3/3291* (2013.01); *H03M 1/36* (2013.01)

(58) Field of Classification Search
  CPC .. G09G 3/3233; G09G 3/3291; G09G 3/3275; G09G 3/006; G09G 2320/0295; G09G 2320/043; G09G 2320/0233; G09G 2300/0842; G09G 2300/0819; G09G 2300/0426; G09G 2300/0828; G09G 2310/0291

See application file for complete search history.

(56) References Cited

U.S. PATENT DOCUMENTS 8,334,825 B2   12/2012 Kim
2016/0189622 A1*   6/2016 Lee ................ G09G 3/3258
                                                              345/212
2017/0154573 A1*   6/2017 Woo ................ G09G 3/3233
(Continued)

FOREIGN PATENT DOCUMENTS

EP    3038089    6/2016
EP    3300064    3/2018

OTHER PUBLICATIONS

Extended European search report dated Jan. 13, 2022 from the European Patent Office in corresponding European Patent Application No. 21194912.8.

*Primary Examiner* — Dong Hui Liang

(74) *Attorney, Agent, or Firm* — F. Chau & Associates, LLC

(57) ABSTRACT

A sensing circuit includes a first input selecting circuit connected to a first sensing line and a second sensing line, a first path setting circuit that sets a path of a first sensing signal received from the first sensing line or a path of a second sensing signal received from the second sensing line, a second path setting circuit that sets a path of a sensing reference voltage, a first switch matrix connected to the first path setting circuit and the second path setting circuit, a first mode setting circuit connected to a first output terminal of the first switch matrix, a first common sensing amplifier connected to the first mode setting circuit, a second mode setting circuit connected to a second output terminal of the first switch matrix, and a second common sensing amplifier connected to the second mode setting circuit.

20 Claims, 13 Drawing Sheets

(56) References Cited

U.S. PATENT DOCUMENTS

| | | |
|---|---|---|
| 2018/0082639 A1 | 3/2018 | Shin et al. |
| 2019/0051250 A1 | 2/2019 | Lee |
| 2019/0079631 A1* | 3/2019 | Kim ..................... G06F 3/0416 |
| 2019/0102022 A1* | 4/2019 | Jang ..................... G06F 3/0443 |
| 2020/0193905 A1* | 6/2020 | Yoon .................... G09G 3/3291 |
| 2021/0049951 A1* | 2/2021 | Amirkhany ............. G09G 3/32 |

\* cited by examiner

SENSING CIRCUIT AND DISPLAY APPARATUS HAVING THE SAME

CROSS-REFERENCE TO RELATED APPLICATIONS

This application claims priority under 35 U.S.C. § 119 to Korean Patent Application No. 10-2020-0114151, filed on Sep. 7, 2020 in the Korean Intellectual Property Office, the disclosure of which is incorporated by reference herein in its entirety.

TECHNICAL FIELD

Embodiments of the present inventive concept relate to a sensing circuit and a display apparatus including the sensing circuit. More particularly, embodiments of the present inventive concept relate to a sensing circuit that senses an electrical characteristic of a switching element of a pixel and a display apparatus including the sensing circuit.

DISCUSSION OF RELATED ART

Generally, a display apparatus may include a display panel and a display panel driver. The display panel may include a plurality of gate lines, a plurality of data lines, and a plurality of pixels. The display panel driver may include a gate driver and a data driver. The gate driver may output gate signals to the gate lines. The data driver may output data voltages to the data lines. The display panel driver may further include a sensing circuit that receives a sensing signal from the pixel.

In a writing mode, the data driver may output a data voltage to the display panel. In a sensing mode, the data driver may output a sensing data voltage to the display panel. In the sensing mode, the sensing circuit may sense an electrical characteristic of a switching element of a pixel by sensing a voltage of the pixel.

SUMMARY

Embodiments of the present inventive concept provide a sensing circuit capable of increasing a sensing accuracy by sensing a voltage of a switching element of a pixel using a common sensing amplifier disposed in front of (e.g., connected to) an analog-to-digital converter for a plurality of sensing lines.

Embodiments of the present inventive concept also provide a display apparatus including the sensing circuit.

In an embodiment of a sensing circuit according to the present inventive concept, the sensing circuit includes a first input selecting circuit, a first path setting circuit, a second path setting circuit, a first switch matrix, a first mode setting circuit, a first common sensing amplifier, a second mode setting circuit and a second common sensing amplifier. The first input selecting circuit is connected to a first sensing line and a second sensing line. The first path setting circuit is configured to set a path of a first sensing signal received from the first sensing line or a path of a second sensing signal received from the second sensing line. The second path setting circuit is configured to set a path of a sensing reference voltage. The first switch matrix is connected to the first path setting circuit and the second path setting circuit. The first mode setting circuit is connected to a first output terminal of the first switch matrix. The first common sensing amplifier is connected to the first mode setting circuit. The second mode setting circuit is connected to a second output terminal of the first switch matrix. The second common sensing amplifier is connected to the second mode setting circuit.

In an embodiment, the sensing circuit may further include an analog-to-digital converter connected to an output terminal of the first common sensing amplifier and an output terminal of the second common sensing amplifier.

In an embodiment, the first mode setting circuit may include a first mode setting switch connected between the first output terminal of the first switch matrix and a first input terminal of the first common sensing amplifier and a second mode setting switch connected between the first output terminal of the first switch matrix and a first input terminal of the analog-to-digital converter.

In an embodiment, the sensing circuit may further include a first amplifier capacitor and a first amplifier switch connected between the first input terminal of the first common sensing amplifier and the output terminal of the first common sensing amplifier. The first amplifier capacitor and the first amplifier switch may be connected to each other in parallel.

In an embodiment, the second mode setting circuit may include a third mode setting switch connected between the second output terminal of the first switch matrix and a second input terminal of the analog-to-digital converter and a fourth mode setting switch connected between the second output terminal of the first switch matrix and a first input terminal of the second common sensing amplifier.

In an embodiment, the sensing circuit may further include a second amplifier capacitor and a second amplifier switch connected between the first input terminal of the second common sensing amplifier and the output terminal of the second common sensing amplifier. The second amplifier capacitor and the second amplifier switch may be connected to each other in parallel.

In an embodiment, the first input selecting circuit may include a first input selecting switch connected between the first sensing line and a first input node, a second input selecting switch connected between the first sensing line and an initialization terminal, a third input selecting switch connected between the second sensing line and the first input node and a fourth input selecting switch connected between the second sensing line and the initialization terminal.

In an embodiment, the first path setting circuit may include a first path setting switch, a second path setting switch, a third path setting switch, a fourth path setting switch and a first capacitor. The first path setting switch may be connected between a first input node and the third path setting switch. The second path setting switch may be connected between the first path setting switch and the fourth path setting switch. The third path setting switch may be connected between the first path setting switch and the first capacitor. The fourth path setting switch may be connected between the first capacitor and the first switch matrix.

In an embodiment, the second path setting circuit may include a fifth path setting switch, a sixth path setting switch, a seventh path setting switch, an eighth path setting switch and a second capacitor. The fifth path setting switch may be connected between a sensing reference voltage input node configured to receive the sensing reference voltage and the sixth path setting switch. The sixth path setting switch may be connected between the fifth path setting switch and the second capacitor. The seventh path setting switch may be connected between the fifth path setting switch and the eighth path setting switch. The eighth path setting switch may be connected between the second capacitor and the first switch matrix.

In an embodiment, the sensing circuit may further include a first voltage selecting circuit configured to provide the sensing reference voltage to the second path setting circuit. The first voltage selecting circuit may include a first voltage selecting switch including a first end configured to receive a first sensing reference voltage and a second end connected to the fifth path setting switch and a second voltage selecting switch including a first end configured to receive a second sensing reference voltage and a second end connected to the fifth path setting switch.

In an embodiment, the sensing circuit may further include a first calibration circuit connected to the first input selecting circuit. The first calibration circuit may be configured to output a calibration voltage to a first input node.

In an embodiment, the sensing circuit may further include a second input selecting circuit connected to a third sensing line and a fourth sensing line, a third path setting circuit configured to set a path of a third sensing signal received from the third sensing line or a path of a fourth sensing signal received from the fourth sensing line, a fourth path setting circuit configured to set a path of the sensing reference voltage and a second switch matrix connected to the third path setting circuit, the fourth path setting circuit and the first switch matrix.

In an embodiment, the sensing circuit may further include a first channel switching circuit connecting the first path setting circuit and the fourth path setting circuit.

In an embodiment, the first channel switching circuit may include a first channel switching switch connected between the first path setting circuit and a first channel switching node, a second channel switching switch connected between a first node of the fourth path setting circuit and the first channel switching node and a third channel switching switch connected between a second node of the fourth path setting circuit and the first channel switching node.

In an embodiment, the sensing circuit may further include a second channel switching circuit connecting the second path setting circuit and the third path setting circuit.

In an embodiment, the second channel switching circuit may include a fourth channel switching switch connected between a first node of the second path setting circuit and a second channel switching node, a fifth channel switching switch connected between a second node of the second path setting circuit and the second channel switching node and a sixth channel switching switch connected between the third path setting circuit and the second channel switching node.

In an embodiment of a display apparatus according to the present inventive concept, the display apparatus includes a display panel and a readout chip. The display panel is configured to display an image based on input image data. The display panel includes a plurality of data lines, a plurality of sensing lines and a plurality of pixels connected to the plurality of data lines and the plurality of sensing lines. The readout chip is configured to receive a sensing signal through at least one of the plurality of sensing lines and to output a data voltage compensated based on the sensing signal to at least one of the plurality of data lines. The readout chip includes a first input selecting circuit connected to a first sensing pad and a second sensing pad, a first path setting circuit configured to set a path of a first sensing signal received from the first sensing pad or a path of a second sensing signal received from the second sensing pad, a second path setting circuit configured to set a path of a sensing reference voltage, a first switch matrix connected to the first path setting circuit and the second path setting circuit, a first mode setting circuit connected to a first output terminal of the first switch matrix, a first common sensing amplifier connected to the first mode setting circuit, a second mode setting circuit connected to a second output terminal of the first switch matrix and a second common sensing amplifier connected to the second mode setting circuit.

In an embodiment, in a single sensing mode, the first sensing signal of the first sensing pad may be applied to a first input terminal of an analog-to-digital converter through the first common sensing amplifier and the sensing reference voltage may be applied to a second input terminal of the analog-to-digital converter.

In an embodiment, in a differential sensing mode, the first sensing signal of the first sensing pad may be applied to a first input terminal of an analog-to-digital converter through the first common sensing amplifier and a third sensing signal of a third sensing pad may be applied to a second input terminal of the analog-to-digital converter through the second common sensing amplifier.

In an embodiment, in a without amplifier mode, the first sensing signal of the first sensing pad may be applied to a first input terminal of an analog-to-digital converter through a first path that does not pass through the first common sensing amplifier in the first mode setting circuit and the sensing reference voltage may be applied to a second input terminal of the analog-to-digital converter through a second path that does not pass through the second common sensing amplifier in the second mode setting circuit.

According to the sensing circuit and the display apparatus including the sensing circuit, the sensing circuit may sense the electrical characteristic of the switching element of the pixel using the common sensing amplifier disposed in front of (e.g., connected to) the analog-to-digital converter for the plurality of sensing lines. The sensing circuit may use the common sensing amplifier so that the decrease of the sensing accuracy of the electrical characteristic of the switching element of the pixel due to the deviation of feedback capacitances of the sensing amplifiers may be prevented or reduced. In addition, the decrease of the sensing accuracy of the electrical characteristic of the switching element of the pixel due to the voltage difference between the input terminals of the sensing amplifiers due to the offsets of the sensing amplifiers may be prevented or reduced.

The sensing circuit may sense the electrical characteristic of the switching element of the pixel using the common sensing amplifier for the plurality of sensing lines so that the sensing accuracy may be increased. Thus, the accuracy for compensating the electrical characteristic of the switching element of the pixel may be increased, and the display quality of the display panel may be increased.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
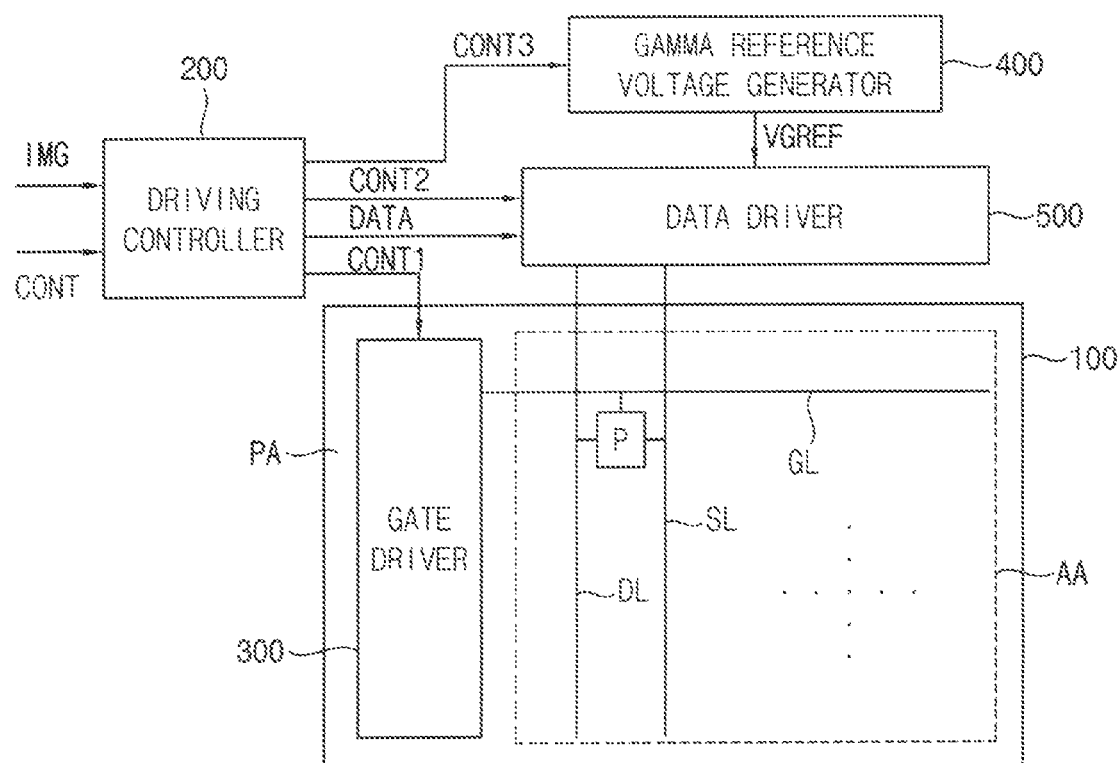
FIG. 1 is a block diagram illustrating a display apparatus according to an embodiment of the present inventive concept.
Figure 1:
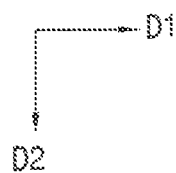

Embodiments of the present inventive concept will be described more fully hereinafter with reference to the accompanying drawings. Like reference numerals may refer to like elements throughout the accompanying drawings.

The terms "first," "second," "third," etc. are used herein to distinguish one element from another, and the elements are not limited by these terms. Thus, a "first" element in an embodiment may be described as a "second" element in another embodiment.

Descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

FIG. 1 is a block diagram illustrating a display apparatus according to an embodiment of the present inventive concept.

Referring to FIG. 1, the display apparatus includes a display panel 100 and a display panel driver. The display panel driver includes a driving controller 200, a gate driver 300, a gamma reference voltage generator 400, and a data driver 500.

In an embodiment, the driving controller 200 and the data driver 500 may be integrally formed. In an embodiment, the driving controller 200, the gamma reference voltage generator 400 and the data driver 500 may be integrally formed. A driving module including at least the driving controller 200 and the data driver 500 which are integrally formed may be referred to as a timing controller embedded data driver (TED).

The display panel 100 has a display region AA in which an image is displayed, and a peripheral region PA adjacent to the display region AA and in which an image is not displayed.

In an embodiment, the display panel 100 may be an organic light emitting diode display panel including an organic light emitting diode. For example, the display panel 100 may be a quantum dot organic light emitting diode display panel including an organic light emitting diode and a quantum dot color filter. For example, the display panel 100 may be a quantum dot nano light emitting diode display panel including a nano light emitting diode and a quantum dot color filter. Alternatively, the display panel 100 may be a liquid crystal display panel including a liquid crystal layer. However, the display panel 100 is not limited to the examples above.

The display panel 100 includes a plurality of gate lines GL, a plurality of data lines DL, and a plurality of pixels P connected to the gate lines GL and the data lines DL. The gate lines GL extend in a first direction D1 and the data lines DL extend in a second direction D2 crossing the first direction D1.

In an embodiment, the display panel 100 may further include a plurality of sensing lines SL connected to the pixels P. The sensing lines SL may extend in the second direction D2.

In an embodiment, the display panel driver may include a sensing circuit that receives a sensing signal from the pixels P of the display panel 100 through the sensing lines SL. The sensing circuit may be disposed in the data driver 500. When the data driver 500 is implemented as an integrated circuit (IC), the sensing circuit may be disposed in a data driving IC. Alternatively, the sensing circuit may be formed independently from the data driver 500. However, the position of the sensing circuit is not limited to the examples above.

The driving controller 200 receives input image data IMG and an input control signal CONT from an external apparatus. The input image data IMG may include, for example, red image data, green image data and blue image data. The input image data IMG may include, for example, white image data. The input image data IMG may include, for example, magenta image data, yellow image data and cyan image data. The input control signal CONT may include a master clock signal and a data enable signal. The input control signal CONT may further include a vertical synchronization signal and a horizontal synchronization signal.

The driving controller 200 generates a first control signal CONT1, a second control signal CONT2, a third control signal CONT3, and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may further include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the driving controller 200. The gate driver 300 outputs the gate signals to the gate lines GL. For example, the gate driver 300 may sequentially output the gate signals to the gate lines GL.

In an embodiment, the gate driver 300 may be integrated in the peripheral region PA of the display panel 100.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an embodiment, the gamma reference voltage generator 400 may be disposed in the driving controller 200. In an embodiment, the gamma reference voltage generator 400 may be disposed in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

Figure 2:
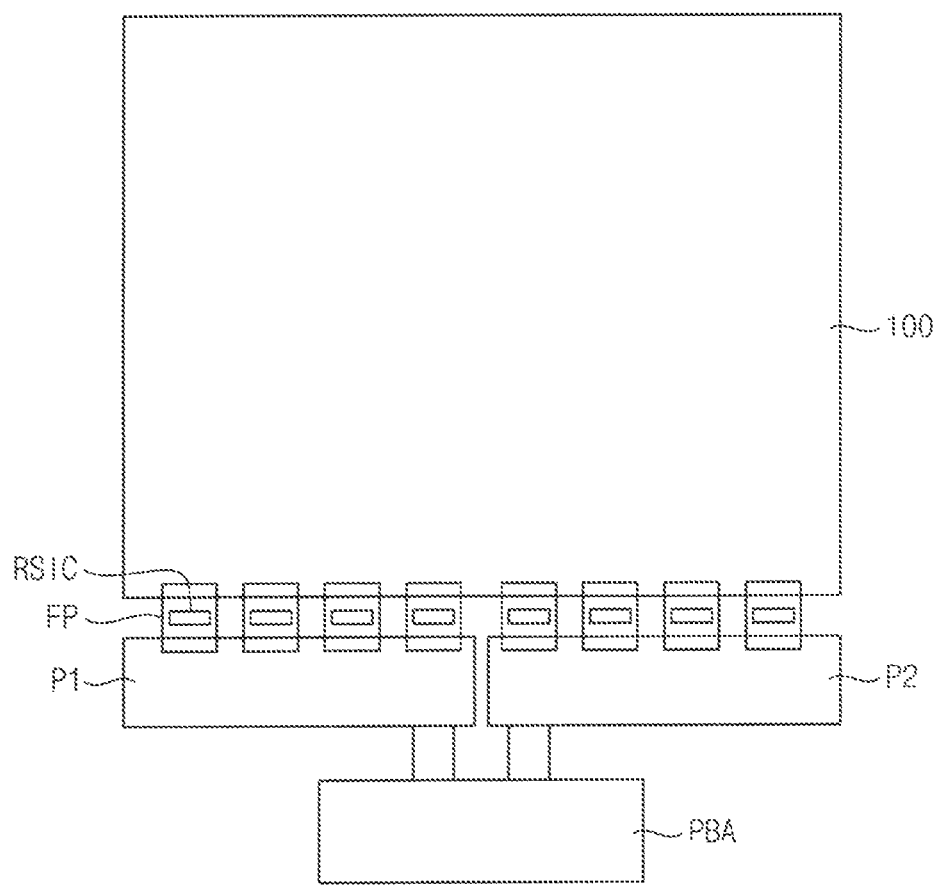
FIG. 2 is a plan view illustrating the display apparatus of FIG. 1 according to an embodiment of the present inventive concept.

FIG. 2 is a plan view illustrating the display apparatus of FIG. 1 according to an embodiment of the present inventive concept.

Referring to FIGS. 1 and 2, the display apparatus may include a printed circuit board assembly PBA, a first printed circuit board P1, and a second printed circuit board P2. The printed circuit board assembly PBA may be connected to the first printed circuit board P1 and the second printed circuit board P2. For example, the driving controller 200 may be disposed on the printed circuit board assembly PBA.

The display apparatus may further include a first plurality of flexible circuit boards FP connected to the first printed circuit board P1 and the display panel 100. The display apparatus may further include a second plurality of flexible circuit boards FP connected to the second printed circuit board P2 and the display panel 100.

Readout chips RSIC of the data driver 500 may be disposed on the flexible circuit boards FP. The readout chip RSIC may be, for example, an integrated circuit chip. The sensing circuit may be disposed in the readout chip RSIC. For example, the readout chips RSIC may include both a function of outputting the data voltage to the display panel 100 and a function of receiving the sensing signal form the display panel 100.

Figure 3:
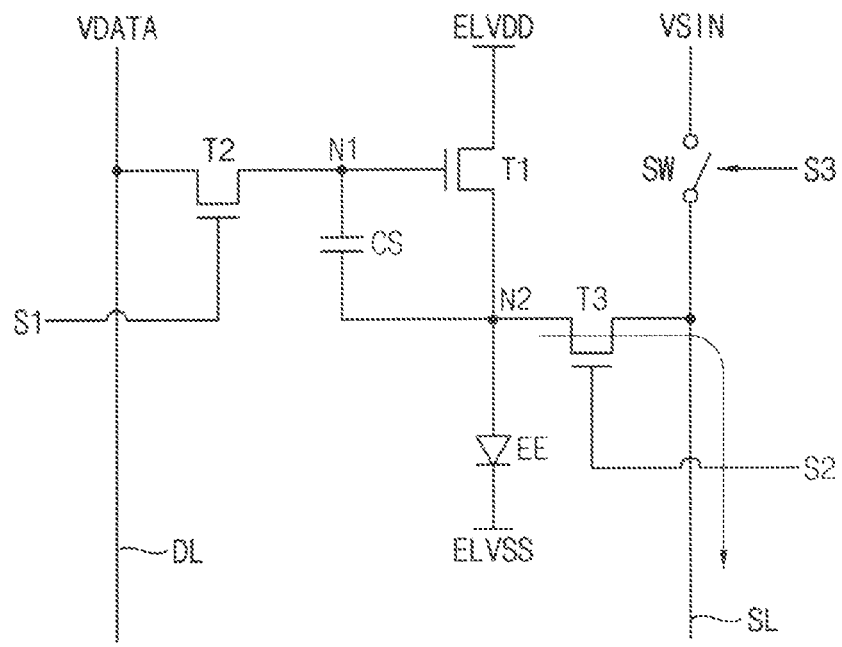
FIG. 3 is a circuit diagram illustrating a pixel of FIG. 1 according to an embodiment of the present inventive concept.
Figure 4:
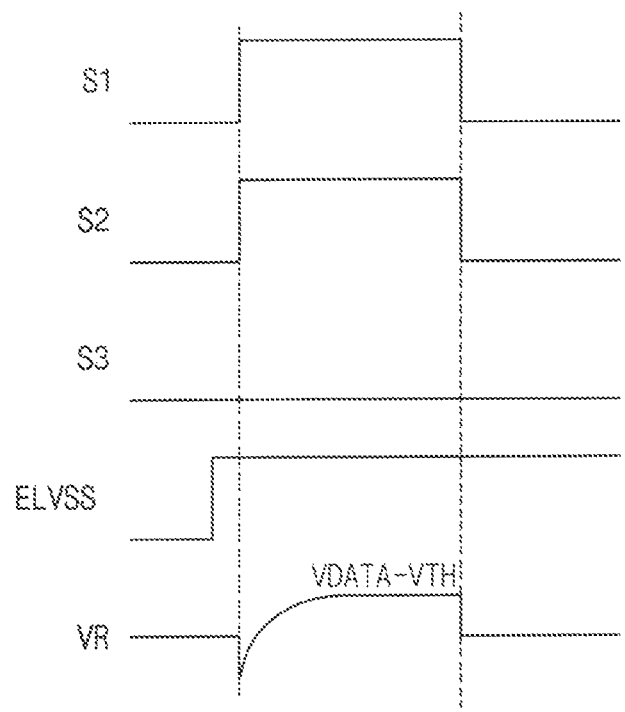
FIG. 4 is a timing diagram illustrating input and output signals of the pixel of FIG. 3 in a sensing mode according to an embodiment of the present inventive concept.

FIG. 3 is a circuit diagram illustrating the pixel P of FIG. 1 according to an embodiment of the present inventive concept. FIG. 4 is a timing diagram illustrating input and output signals of the pixel P of FIG. 3 in a sensing mode according to an embodiment of the present inventive concept.

Referring to FIGS. 1 to 4, the pixel P may include a first thin-film transistor T1 that applies a first power voltage ELVDD to a second node N2 in response to a signal at a first node N1, a second thin-film transistor T2 that outputs the data voltage VDATA to the first node N1 in response to a first signal S1, a third thin-film transistor T3 that outputs a signal at the second node N2 to a sensing node in response to a second signal S2, a storage capacitor CS including a first end portion connected to the first node N1 and a second end portion connected to the second node N2, and a light emitting element EE including a first electrode connected to the second node N2 and a second electrode that receives a second power voltage ELVSS.

Herein, the second power voltage ELVSS may be less than the first power voltage ELVDD. The light emitting element may be, for example, an organic light emitting diode.

The pixel P may further include a sensing initialization switch SW that writes a sensing initialization voltage VSIN to the second node N2. The sensing initialization switch SW may be turned on and turned off based on a third signal S3.

For example, in an embodiment, the second signal S2 and the third signal S3 are activated in a sensing initialization operation so that the sensing initialization voltage VSIN may be applied to the second node N2.

As shown in FIG. 4, the first signal S1 is activated in a sensing mode so that a data voltage VDATA may be applied to the first node N1 through the second thin-film transistor T2. Herein, the data voltage VDATA may be a sensing data voltage used to sense an electrical characteristic of the first thin-film transistor T1. The electrical characteristic of the first thin-film transistor T1 may be, for example, a mobility of the first thin-film transistor T1 or a threshold voltage of the first thin-film transistor T1. The data voltage VDATA may be a sensing data voltage used to sense an electrical characteristic of the light emitting element EE. The electrical characteristic of the light emitting element EE may be, for example, a capacitance between both electrodes of the light emitting element EE.

In the sensing mode, the first thin-film transistor T1 is turned on by the sensing data voltage applied to the first node in the sensing mode and the sensing initialization voltage VSIN which is already applied to the second node in the sensing initialization operation.

In addition, the second signal S2 is also activated in the sensing mode so that the third thin-film transistor T3 is turned on and a sensing signal VR at the second node N2 may be output to the sensing line SL through the third thin-film transistor T3 in the sensing mode.

The sensing line SL may be connected to the sensing circuit. The sensing circuit may include an analog-to-digital converter. The analog-to-digital converter may convert the sensing signal VR at the second node N2 to a digital sensing signal to determine the threshold voltage VTH of the first thin-film transistor T1.

In an embodiment, in the sensing mode, the third signal S3 is deactivated so that the sensing initialization voltage VSIN is not output to the sensing node in the sensing mode.

In an embodiment, in the sensing mode, the second power voltage ELVSS has a high level so that the pixel P does not emit light.

The data driver 500 may be operated in a writing mode and in the sensing mode. In the writing mode, the data voltage for displaying an image may be written in the pixels P of the display panel 100. In the sensing mode, the threshold voltage of the pixels P may be sensed from the pixels P. In the writing mode, the data driver 500 may output the data voltage corresponding to the grayscale values of the input image data IMG to the data line DL. In contrast, in the sensing mode, the data driver 500 may output the sensing data voltage to sense the threshold voltage of the first thin-film transistor T1 to the data line DL. In the sensing mode, the sensing circuit may determine the threshold voltage of the pixel P based on the sensing signal received through the sensing line SL.

The sensing mode may be operated in a power on period when the display apparatus starts to turn on, in a blank period between active periods when the image is written to the display panel 100, and in a power off period when the display apparatus starts to turn off. The driving controller 200 may compensate the data applied to the pixel P according to the sensed threshold voltage of the pixel P and output the compensated data to the data driver 500. The data driver 500 may output the compensated data voltage, which is based on the sensing signal, to the data line DL.

Figure 5:
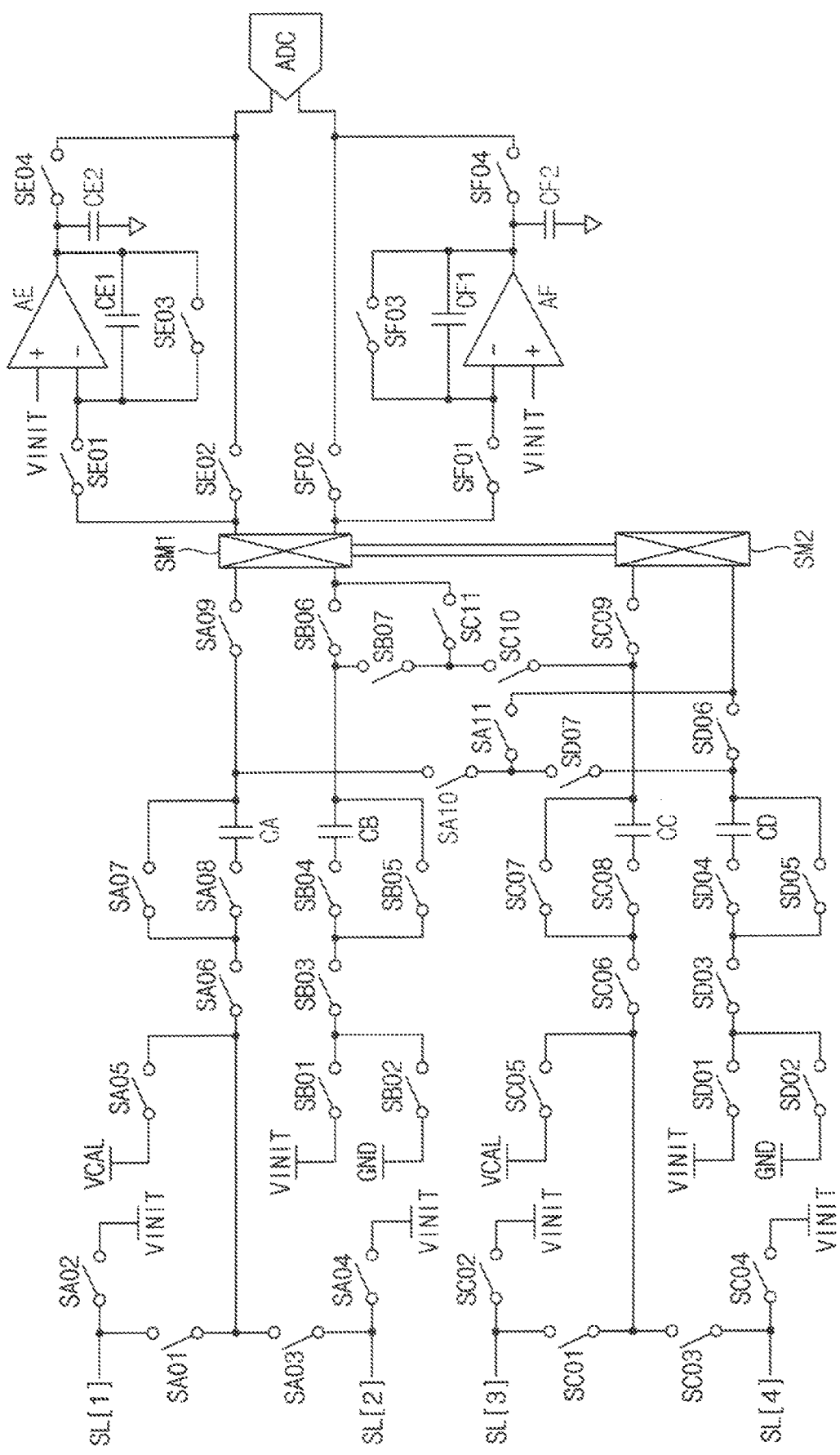
FIG. 5 is a circuit diagram illustrating a sensing circuit of the display apparatus of FIG. 1 according to an embodiment of the present inventive concept.

FIG. 5 is a circuit diagram illustrating a sensing circuit of the display apparatus of FIG. 1 according to an embodiment of the present inventive concept.

Referring to FIGS. 1 to 5, the sensing circuit may be disposed in the data driver 500 as described above. When the data driver 500 is a data driving IC (e.g., RSIC in FIG. 2), the sensing circuit may be disposed in the data driving IC (e.g., RSIC in FIG. 2). The sensing line SL of FIG. 3 may be a portion connected to the pixel P of the display panel 100. SL[1], SL[2], SL[3] and SL[4] of FIG. 5 may be connected to the sensing lines SL of the display panel 100 and may transmit the sensing signal from the sensing lines SL into the sensing circuit. For example, in an embodiment, SL[1], SL[2], SL[3] and SL[4] of FIG. 5 may be sensing pads of the sensing circuit RSIC connected to the sensing lines SL of the display panel 100. Thus, according to embodiments of the present inventive concept, SL[1], SL[2], SL[3] and SL[4] may refer to sensing lines or sensing pads connected to corresponding sensing lines. Hereinafter, SL[1], SL[2], SL[3] and SL[4] of FIG. 5 are respectively referred to as first to fourth sensing lines.

The sensing circuit may include a first input selecting circuit including switches SA01, SA02, SA03 and SA04 connected to the first sensing line SL[1] and the second sensing line SL[2], a first path setting circuit including switches SA06, SA07, SA08, SA09 and capacitor CA that sets a path of a first sensing signal received from the first sensing line SL[1] or a path of a second sensing signal received from the second sensing line SL[2], a second path setting circuit including switches SB03, SB04, SB05, SB06 and capacitor CB that sets a path of a sensing reference voltage, a first switch matrix SM1 connected to the first path setting circuit (switches SA06, SA07, SA08, SA09 and capacitor CA) and the second path setting circuit (switches SB03, SB04, SB05, SB06 and capacitor CB), a first mode setting circuit including switches SE01 and SE02 connected to a first output terminal of the first switch matrix SM1, a first common sensing amplifier AE connected to the first mode setting circuit (switches SE01 and SE02), a second mode setting circuit including switches SF01 and SF02 connected to a second output terminal of the first switch matrix SM1, and a second common sensing amplifier AF connected to the second mode setting circuit (SF01 and SF02).

The sensing circuit may further include an analog-to-digital converter ADC connected to an output terminal of the first common sensing amplifier AE and an output terminal of the second common sensing amplifier AF. The output terminal of the first common sensing amplifier AE may be connected to a first input terminal of the analog-to-digital converter ADC through a first amplifier output switch SE04. The output terminal of the second common sensing amplifier AF may be connected to a second input terminal of the analog-to-digital converter ADC through a second amplifier output switch SF04.

The switches SA01, SA02, SA03 and SA04 that form the first input selecting circuit may include a first input selecting switch SA01 connected between the first sensing line SL[1] and a first input node, a second input selecting switch SA02 connected between the first sensing line SL[1] and an initialization terminal, a third input selecting switch SA03 connected between the second sensing line SL[2] and the first input node, and a fourth input selecting switch SA04 connected between the second sensing line SL[2] and the initialization terminal. An initialization voltage VINIT may be applied to the initialization terminal.

The first input selecting circuit may apply the first sensing signal of the first sensing line SL[1] to the first input node by turning on the first input selecting switch SA01 and turning off the third input selecting switch SA03.

The first input selecting circuit may apply the second sensing signal of the second sensing line SL[2] to the first input node by turning on the third input selecting switch SA03 and turning off the first input selecting switch SA01.

The first input selecting circuit may use the second input selecting switch SA02 or the fourth input selecting switch SA04 to initialize the first input node.

The switches SA06, SA07, SA08 and SA09 and capacitor CA that form the first path setting circuit may include a first path setting switch SA06, a second path setting switch SA07, a third path setting switch SA08, a fourth path setting switch SA09, and a first capacitor CA.

The first path setting switch SA06 may be connected between the first input node and the third path setting switch SA08. The second path setting switch SA07 may be connected between the first path setting switch SA06 and the fourth path setting switch SA09. The third path setting switch SA08 may be connected between the first path setting switch SA06 and the first capacitor CA. The fourth path setting switch SA09 may be connected between the first capacitor CA and the first switch matrix SM1.

The sensing circuit may further include a first calibration circuit connected to the first input selecting circuit. The first calibration circuit may output a calibration voltage VCAL to the first input node when a calibration switch SA05 is turned on.

The switches SB03, SB04, SB05 and SB06 and capacitor CB that form the second path setting circuit may include a fifth path setting switch SB03, a sixth path setting switch SB04, a seventh path setting switch SB05, an eighth path setting switch SB06, and a second capacitor CB.

The fifth path setting switch SB03 may be connected between a sensing reference voltage input node that receives the sensing reference voltage and the sixth path setting switch SB04. The sixth path setting switch SB04 may be connected between the fifth path setting switch SB03 and the second capacitor CB. The seventh path setting switch SB05 may be connected between the fifth path setting switch SB03 and the eighth path setting switch SB06. The eighth path setting switch SB06 may be connected between the second capacitor CB and the first switch matrix SM1.

The sensing circuit may further include a first voltage selecting circuit including switches SB01 and SB02 that provides the sensing reference voltage to the second path setting circuit (switches SB03, SB04, SB05 and SB06 and capacitor CB).

The switches SB01 and SB02 that form the first voltage selecting circuit may include a first voltage selecting switch SB01 including a first end that receives a first sensing reference voltage (e.g., VINIT) and a second end connected to the fifth path setting switch SB03, and a second voltage selecting switch SB02 including a first end that receives a second sensing reference voltage (e.g., GND) and a second end connected to the fifth path setting switch SB03.

The first voltage selecting circuit (switches SB01 and SB02) may determine the sensing reference voltage by selecting one of the initialization voltage VINIT and a ground voltage GND.

The sensing circuit may further include a second input selecting circuit including switches SC01, SC02, SC03 and SC04 connected to the third sensing line SL[3] and the fourth sensing line SL[4], a third path setting circuit including switches SC06, SC07, SC08, SC09 and capacitor CC that sets a path of a third sensing signal received from the third sensing line SL[3] or a path of a fourth sensing signal received from the fourth sensing line SL[4], a fourth path setting circuit including switches SD03, SD04, SD05, SD06 and capacitor CD that sets a path of the sensing reference voltage, and a second switch matrix SM2 connected to the third path setting circuit (switches SC06, SC07, SC08 and SC09 and capacitor CC), the fourth path setting circuit (switches SD03, SD04, SD05, SD06 and capacitor CD) and the first switch matrix SM1.

The sensing circuit may further include a second calibration circuit connected to the second input selecting circuit. The second calibration circuit may output the calibration voltage VCAL to the second input selecting circuit when a calibration switch SC05 is turned on.

The structure of the second input selecting circuit (switches SC01, SC02, SC03 and SC04) may be substantially the same as the structure of the first input selecting circuit (switches SA01, SA02, SA03 and SA04). The structure of the third path setting circuit (switches SC06, SC07, SC08 and SC09 and capacitor CC) may be substantially the same as the structure of the first path setting circuit (switches SA06, SA07, SA08 and SA09 and capacitor CA). The structure of the fourth path setting circuit (switches SD03, SD04, SD05 and SD06 and capacitor CD) may be substantially the same as the structure of the second path setting circuit (switches SB03, SB04, SB05 and SB06 and capacitor CB).

The sensing circuit may further include a second voltage selecting circuit including switches SD01 and SD02 that provides the sensing reference voltage to the fourth path setting circuit (switches SD03, SD04, SD05 and SD06 and capacitor CD). The structure of the second voltage selecting circuit (switches SD01 and SD02) may be substantially the same as the structure of the first voltage selecting circuit (switches SB01 and SB02).

The sensing circuit may further include a first channel switching circuit including switches SA10, SA11 and SD07 that connects the first path setting circuit (switches SA06, SA07, SA08 and SA09 and capacitor CA) and the fourth path setting circuit (switches SD03, SD04, SD05 and SD06 and capacitor CD).

The switches SA10, SA11 and SD07 forming the first channel switching circuit may include a first channel switching switch SA10 connected between the first path setting circuit (switches SA06, SA07, SA08 and SA09 and capacitor CA) and a first channel switching node, a second channel switching switch SA11 connected between a first node of the fourth path setting circuit (switches SD03, SD04, SD05 and SD06 and capacitor CD) and the first channel switching node, and a third channel switching switch SD07 connected between a second node of the fourth path setting circuit (switches SD03, SD04, SD05 and SD06 and capacitor CD) and the first channel switching node.

The sensing circuit may further include a second channel switching circuit including switches SB07, SC10 and SC11 that connects the second path setting circuit (switches SB03, SB04, SB05 and SB06 and capacitor CB) and the third path setting circuit (switches SC06, SC07, SC08 and SC09 and capacitor CC).

The switches SB07, SC10 and SC11 that form the second channel switching circuit may include a fourth channel switching switch SB07 connected between a first node of the second path setting circuit (switches SB03, SB04, SB05 and SB06 and capacitor CB) and a second channel switching node, a fifth channel switching switch SC11 connected between a second node of the second path setting circuit (switches SB03, SB04, SB05 and SB06 and capacitor CB) and the second channel switching node, and a sixth channel switching switch SC10 connected between the third path setting circuit (switches SC06, SC07, SC08 and SC09 and capacitor CC) and the second channel switching node.

The first mode setting circuit (switches SE01 and SE02) may set different paths according to a mode of the sensing circuit. The switches SE01 and SE02 that form the first mode setting circuit may include a first mode setting switch SE01 connected between the first output terminal of the first switch matrix SM1 and a first input terminal of the first common sensing amplifier AE, and a second mode setting switch SE02 connected between the first output terminal of the first switch matrix SM1 and a first input terminal of the analog-to-digital converter ADC.

The sensing circuit may further include a first amplifier capacitor CE1 and a first amplifier switch SE03, which are connected between the first input terminal of the first common sensing amplifier AE and the output terminal of the first common sensing amplifier AE. The first amplifier capacitor CE1 and the first amplifier switch SE03 may be connected to each other in parallel. The initialization voltage VINIT may be applied to a second input terminal of the first common sensing amplifier AE.

The output terminal of the first common sensing amplifier AE may be connected to the first input terminal of the analog-to-digital converter ADC through the first amplifier output switch SE04. A first amplifier output capacitor CE2 may be connected to the output terminal of the first common sensing amplifier AE.

The second mode setting circuit (switches SF01 and SF02) may set different paths according to the mode of the sensing circuit. The switches SF01 and SF02 that form the second mode setting circuit may include a third mode setting switch SF01 connected between the second output terminal of the first switch matrix SM1 and a second input terminal of the analog-to-digital converter ADC, and a fourth mode setting switch SF02 connected between the second output terminal of the first switch matrix SM1 and a first input terminal of the second common sensing amplifier AF.

The sensing circuit may further include a second amplifier capacitor CF1 and a second amplifier switch SF03, which are connected between the first input terminal of the second common sensing amplifier AF and the output terminal of the second common sensing amplifier AF. The second amplifier capacitor CF1 and the second amplifier switch SF03 may be connected to each other in parallel. The initialization voltage VINIT may be applied to a second input terminal of the second common sensing amplifier AF.

The output terminal of the second common sensing amplifier AF may be connected to the second input terminal of the analog-to-digital converter ADC through the second amplifier output switch SF04. A second amplifier output capacitor CF2 may be connected to the output terminal of the second common sensing amplifier AF.

Figure 6:
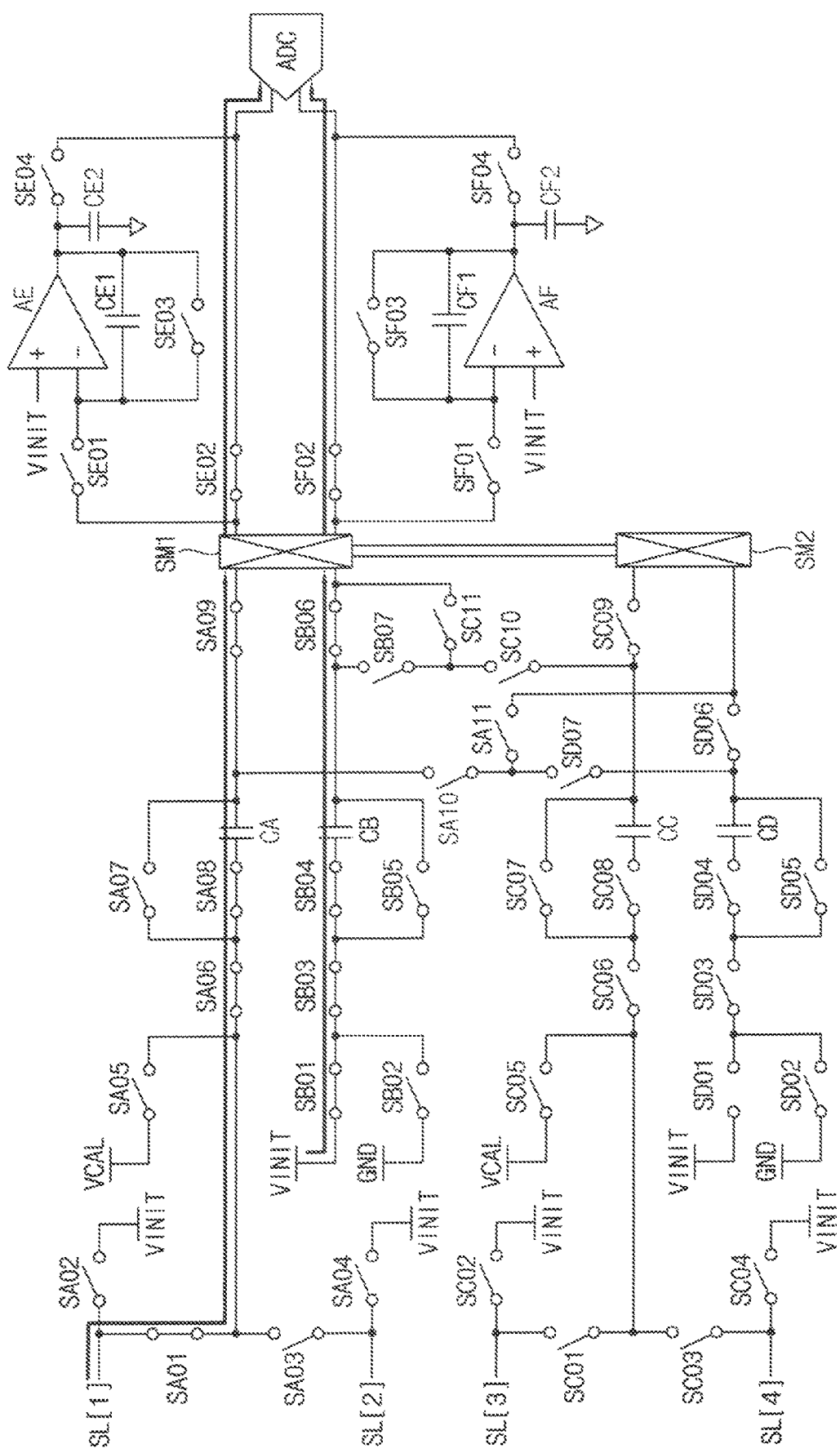
FIG. 6 is a circuit diagram illustrating the sensing circuit of FIG. 5 sensing a sensing signal of a first sensing line in a first mode according to an embodiment of the present inventive concept.

FIG. 6 is a circuit diagram illustrating the sensing circuit of FIG. 5 sensing a sensing signal of the first sensing line SL[1] in a first mode according to an embodiment of the present inventive concept.

Referring to FIG. 6, the first mode is a "without amplifier mode" in which the sensing signal is sensed without using the first common sensing amplifier AE and the second common sensing amplifier AF. In FIG. 6, the signal of the first sensing line SL[1] may be sensed in the without amplifier mode.

In FIG. 6, switch SA01 of the first input selecting circuit is turned on, and switches SA06, SA08 and SA09 of the first path setting circuit are turned on so that the signal of the first sensing line SL[1] is applied to the first input terminal of the first switch matrix SM1.

Switch SB01 of the first voltage selecting circuit is turned on so that the sensing reference voltage is set to VINIT. Switches SB03, SB04 and SB06 are turned on so that the sensing reference voltage is applied to the second input terminal of the first switch matrix SM1.

Switch SE02 of the first mode setting circuit is turned on so that the signal of the first sensing line SL[1] is applied to the first input terminal of the analog-to-digital converter ADC.

Switch SF02 of the second mode setting circuit is turned on so that the sensing reference voltage is applied to the second input terminal of the analog-to-digital converter ADC.

Figure 7:
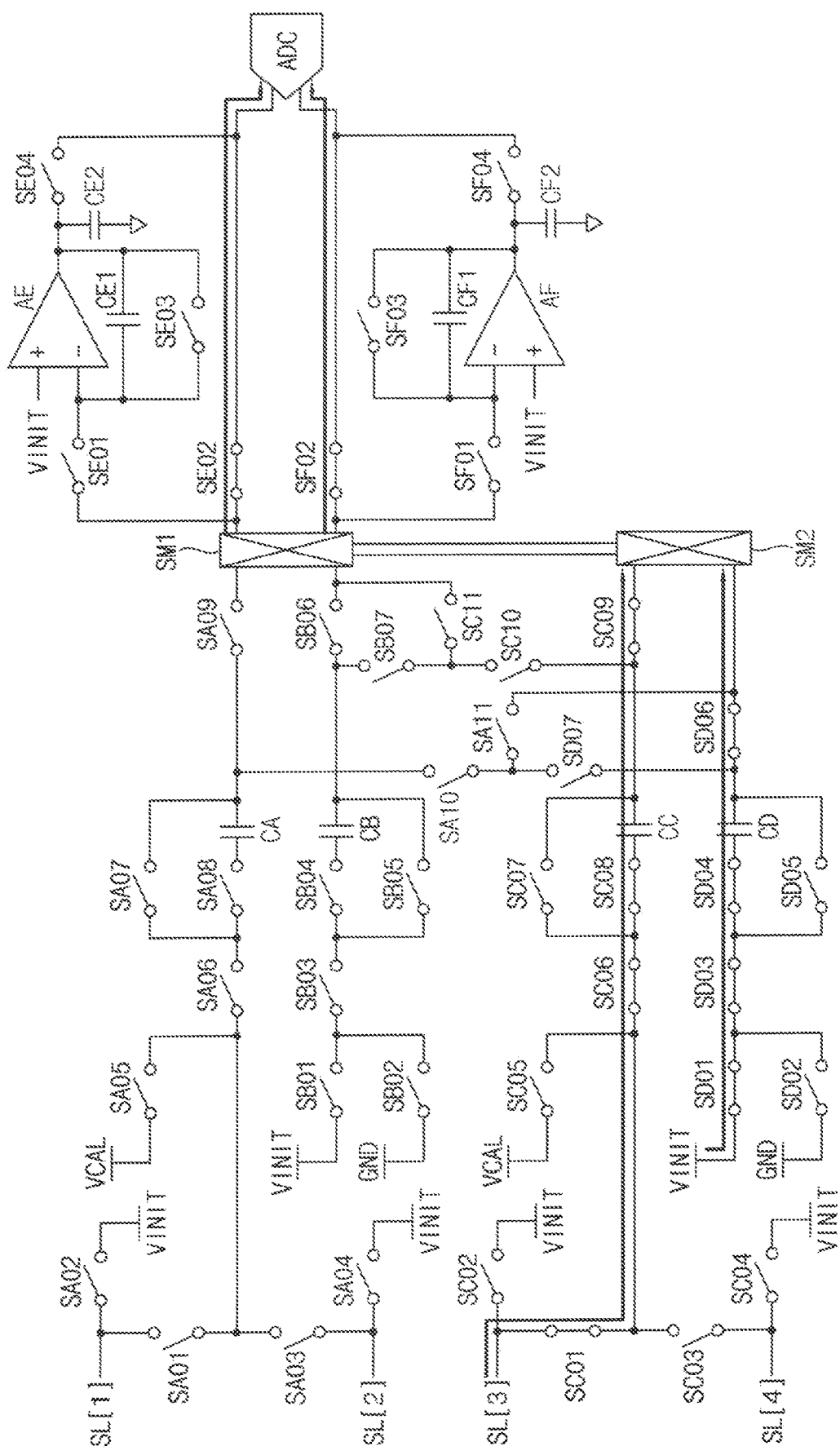
FIG. 7 is a circuit diagram illustrating the sensing circuit of FIG. 5 sensing a sensing signal of a third sensing line in the first mode according to an embodiment of the present inventive concept.

FIG. 7 is a circuit diagram illustrating the sensing circuit of FIG. 5 sensing a sensing signal of the third sensing line SL[3] in the first mode according to an embodiment of the present inventive concept.

Referring to FIG. 7, the first mode is the without amplifier mode. In FIG. 7, the signal of the third sensing line SL[3] may be sensed in the without amplifier mode.

In FIG. 7, switch SC01 of the second input selecting circuit is turned on, and switches SC06, SC08 and SC09 of the third path setting circuit are turned on so that the signal of the third sensing line SL[3] is applied to the first input terminal of the second switch matrix SM2.

Switch SD01 of the second voltage selecting circuit is turned on so that the sensing reference voltage is set to VINIT. Switches SD03, SD04 and SD06 are turned on so that the sensing reference voltage is applied to the second input terminal of the second switch matrix SM2.

The signal applied to the second switch matrix SM2 may be transmitted to the first switch matrix SM1.

Switch SE02 of the first mode setting circuit is turned on so that the signal of the third sensing line SL[3] is applied to the first input terminal of the analog-to-digital converter ADC.

Switch SF02 of the second mode setting circuit is turned on so that the sensing reference voltage is applied to the second input terminal of the analog-to-digital converter ADC.

Figure 8:
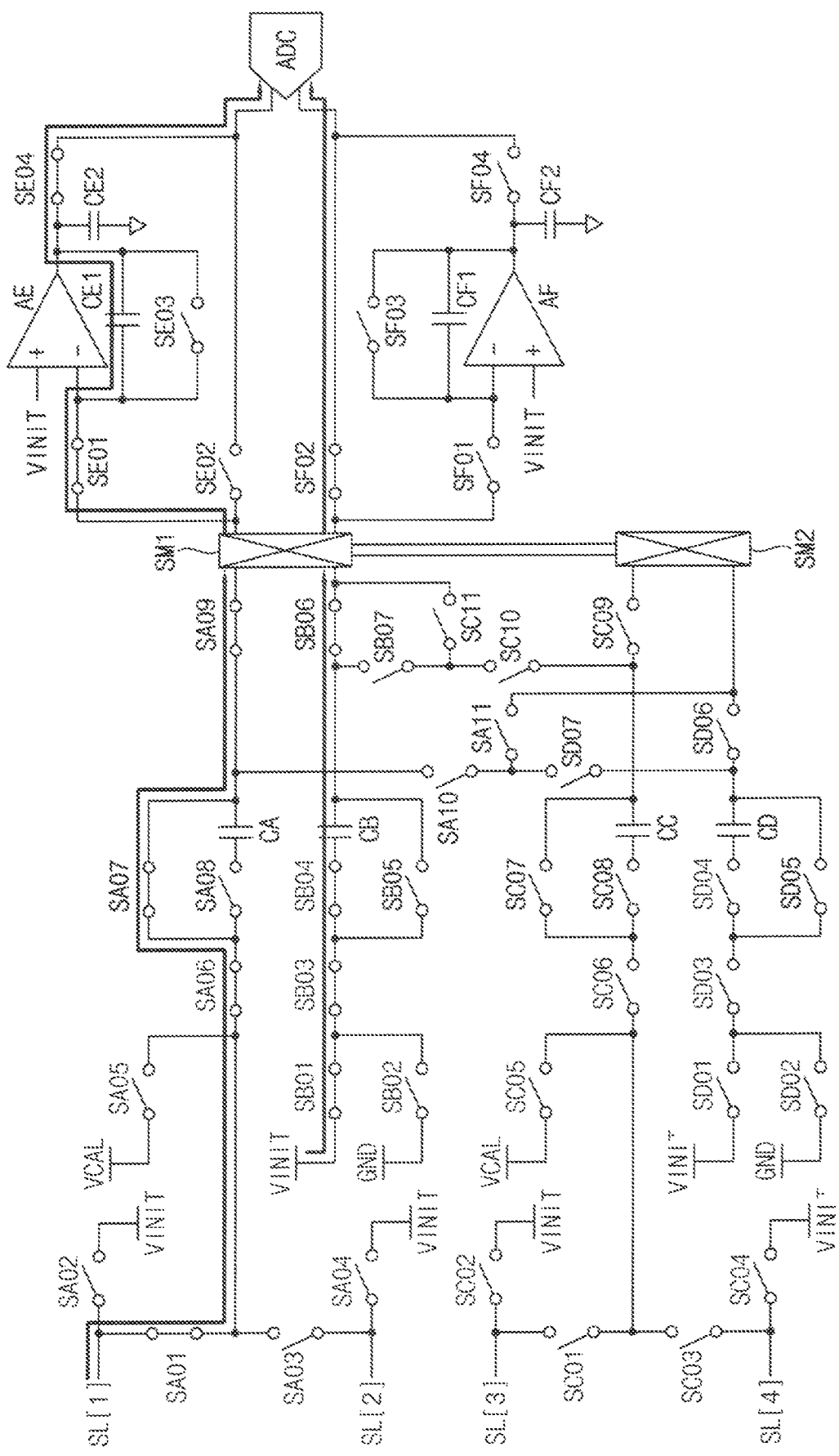
FIG. 8 is a circuit diagram illustrating the sensing circuit of FIG. 5 sensing a sensing signal of the first sensing line in a second mode according to an embodiment of the present inventive concept.
Figure 9:
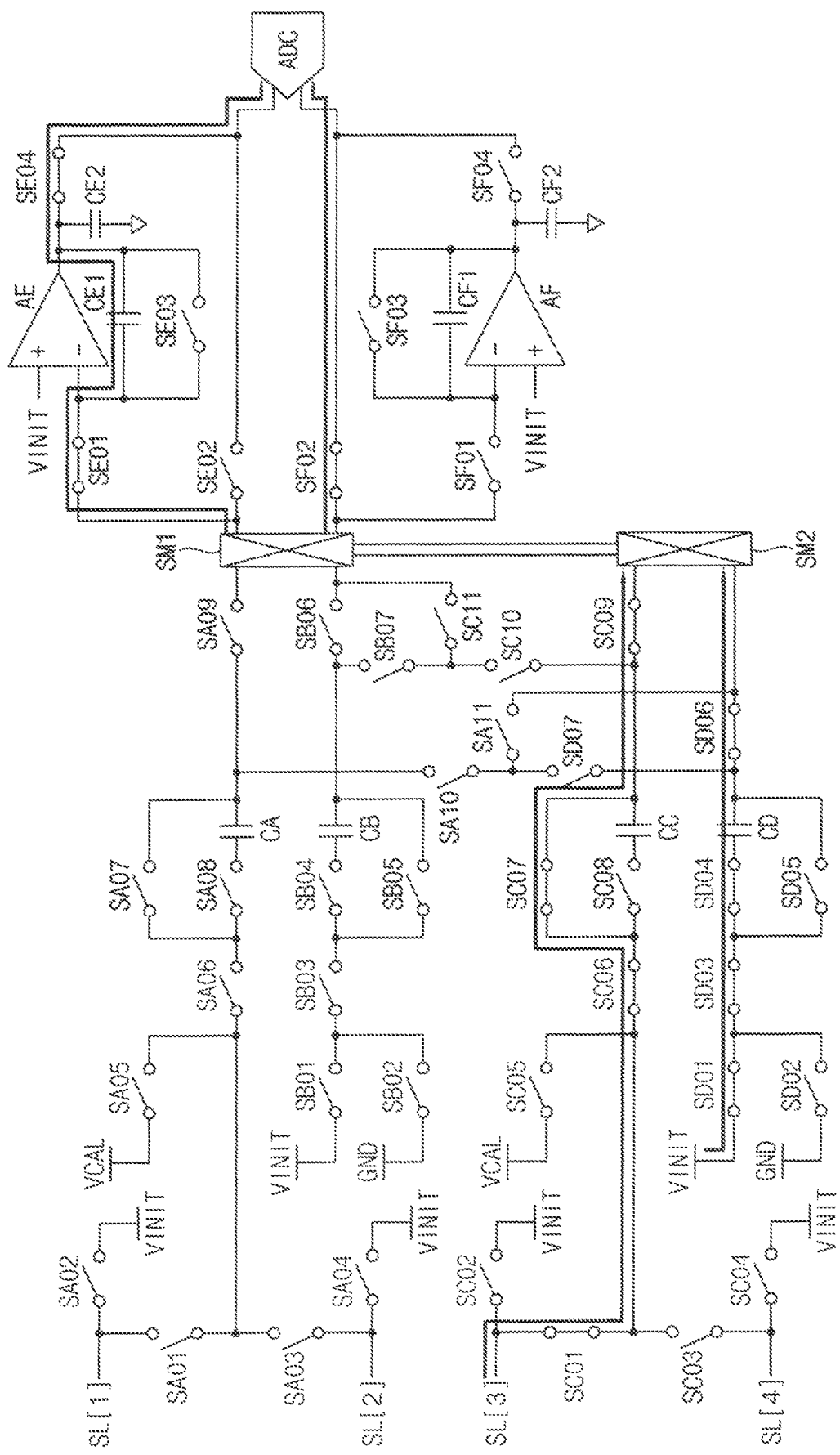
FIG. 9 is a circuit diagram illustrating the sensing circuit of FIG. 5 sensing a sensing signal of the third sensing line in the second mode according to an embodiment of the present inventive concept.
Figure 10:
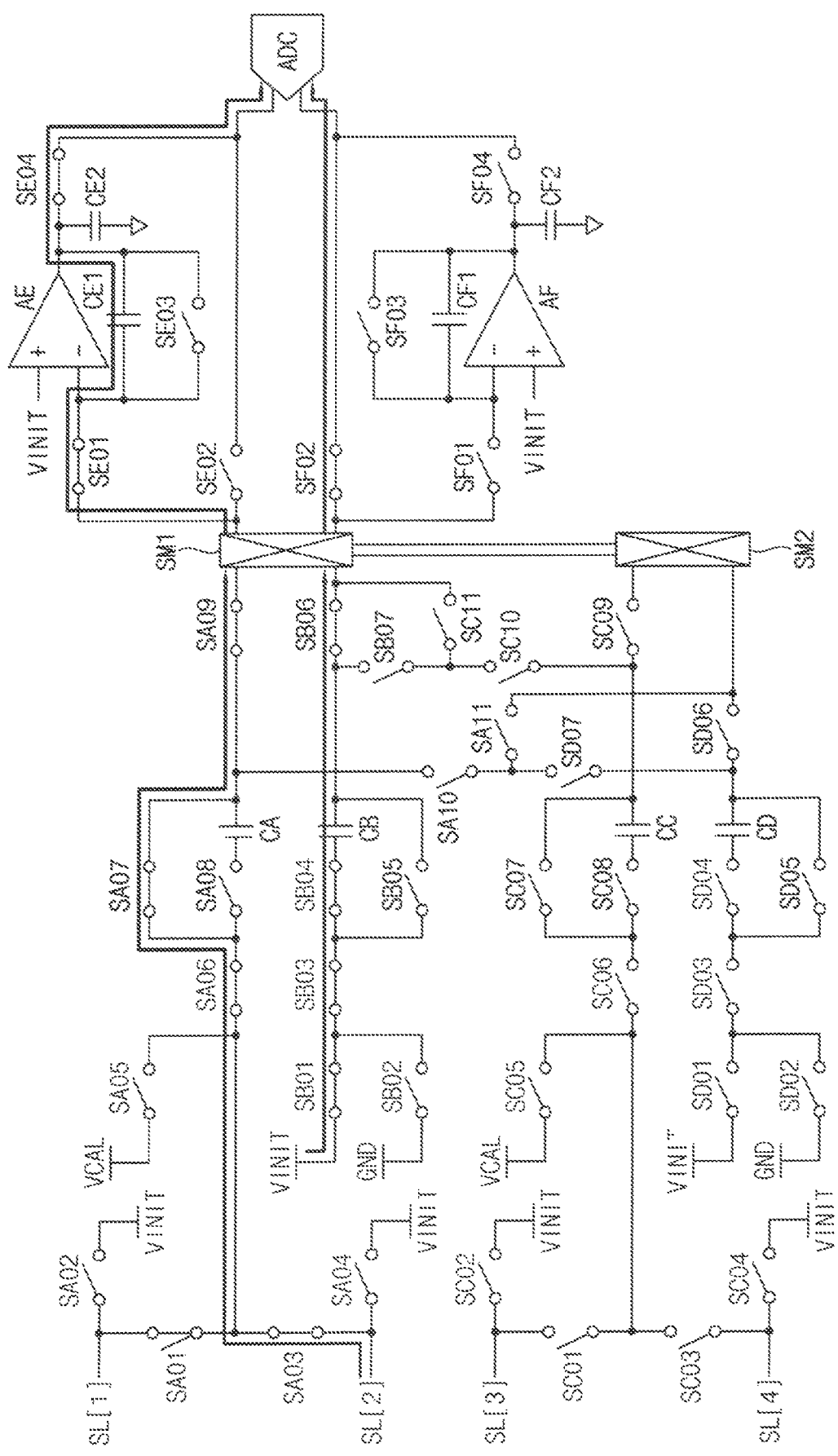
FIG. 10 is a circuit diagram illustrating the sensing circuit of FIG. 5 sensing a sensing signal of a second sensing line in the second mode according to an embodiment of the present inventive concept.

FIG. 8 is a circuit diagram illustrating the sensing circuit of FIG. 5 sensing a sensing signal of the first sensing line SL[1] in a second mode according to an embodiment of the present inventive concept. FIG. 9 is a circuit diagram illustrating the sensing circuit of FIG. 5 sensing a sensing signal of the third sensing line SL[3] in the second mode according to an embodiment of the present inventive concept. FIG. 10 is a circuit diagram illustrating the sensing circuit of FIG. 5 sensing a sensing signal of the second sensing line SL[2] in the second mode according to an embodiment of the present inventive concept.

Referring to FIGS. 8 to 10, the second mode is a "single sensing mode." In the single sensing mode, the sensing signal is applied to the first input terminal of the analog digital converter ADC through the first common sensing amplifier AE, and the sensing reference voltage may be applied to the second terminal of the analog-to-digital converter ADC.

In FIG. 8, switches SA01, SA06, SA07 and SA09 are turned on so that the signal of the first sensing line SL[1] may be applied to the first input terminal of the first switch matrix SM1.

Switches SB01, SB03, SB04 and SB06 are turned on so that the sensing reference voltage may be applied to the second input terminal of the first switch matrix SM1.

Switches SE01 and SE04 of the first mode setting circuit are turned on so that the signal of the first sensing line SL[1] is applied to the first input terminal of the analog-to-digital converter ADC through the first common sensing amplifier AE.

Switch SF02 of the second mode setting circuit is turned on so that the sensing reference voltage is applied to the second input terminal of the analog-to-digital converter ADC.

In FIG. 9, switches SC01, SC06, SC07 and SC09 are turned on so that the signal of the third sensing line SL[3] may be applied to the first input terminal of the second switch matrix SM2.

Switches SD01, SD03, SD04 and SD06 are turned on so that the sensing reference voltage may be applied to the second input terminal of the second switch matrix SM2.

Switches SE01 and SE04 of the first mode setting circuit are turned on so that the signal of the third sensing line SL[3] is applied to the first input terminal of the analog-to-digital converter ADC through the first common sensing amplifier AE.

Switch SF02 of the second mode setting circuit is turned on so that the sensing reference voltage is applied to the second input terminal of the analog-to-digital converter ADC.

In FIG. 10, switches SA03, SA06, SA07 and SA09 are turned on so that the signal of the second sensing line SL[2] may be applied to the first input terminal of the first switch matrix SM1.

Switches SB01, SB03, SB04 and SB06 are turned on so that the sensing reference voltage may be applied to the second input terminal of the first switch matrix SM1.

Switches SE01 and SE04 of the first mode setting circuit are turned on so that the signal of the second sensing line SL[2] is applied to the first input terminal of the analog-to-digital converter ADC through the first common sensing amplifier AE.

Switch SF02 of the second mode setting circuit is turned on so that the sensing reference voltage is applied to the second input terminal of the analog-to-digital converter ADC.

Figure 11:
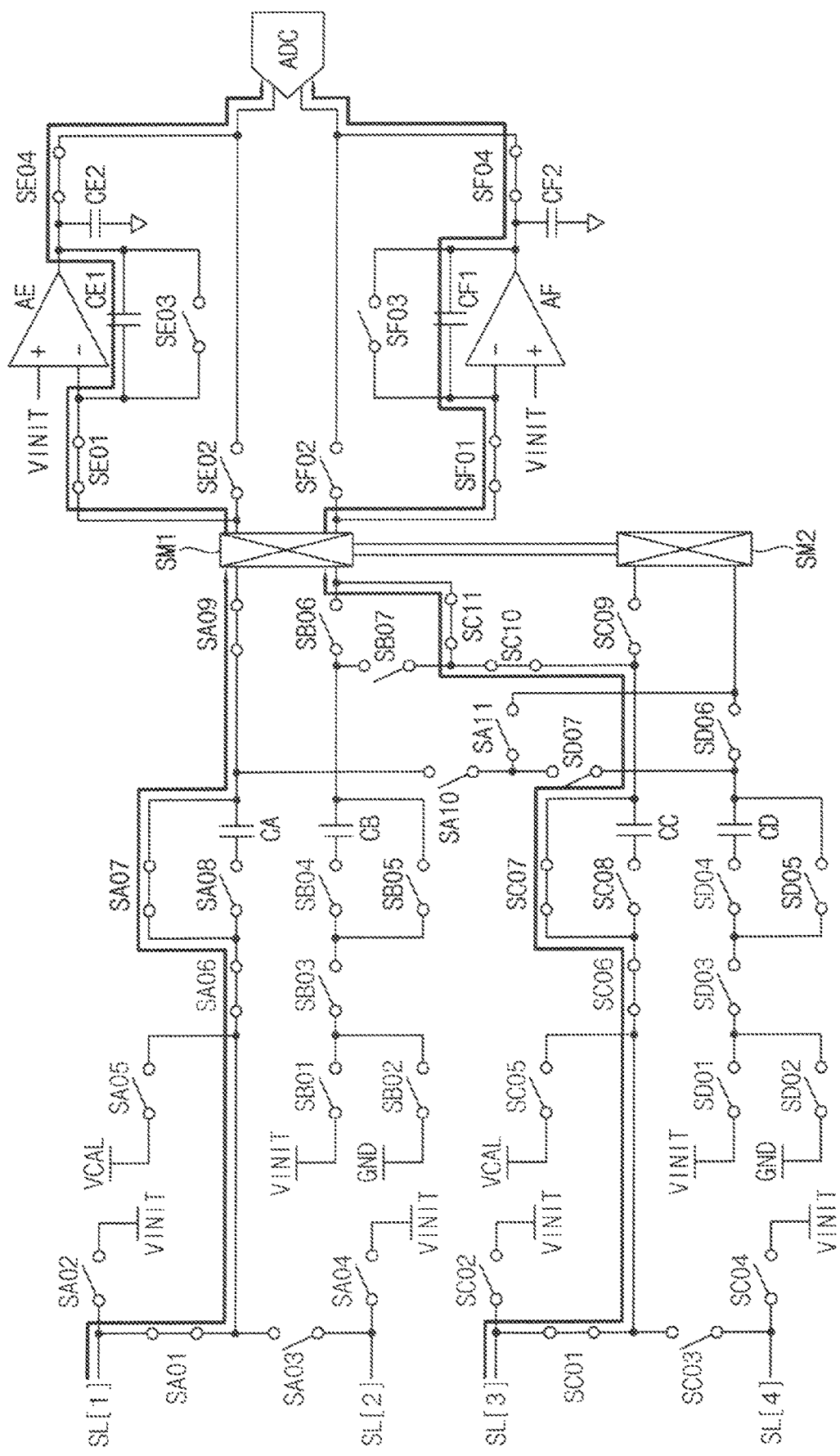
FIG. 11 is a circuit diagram illustrating the sensing circuit of FIG. 5 sensing a sensing signal of the first sensing line in a third mode according to an embodiment of the present inventive concept.
Figure 12:
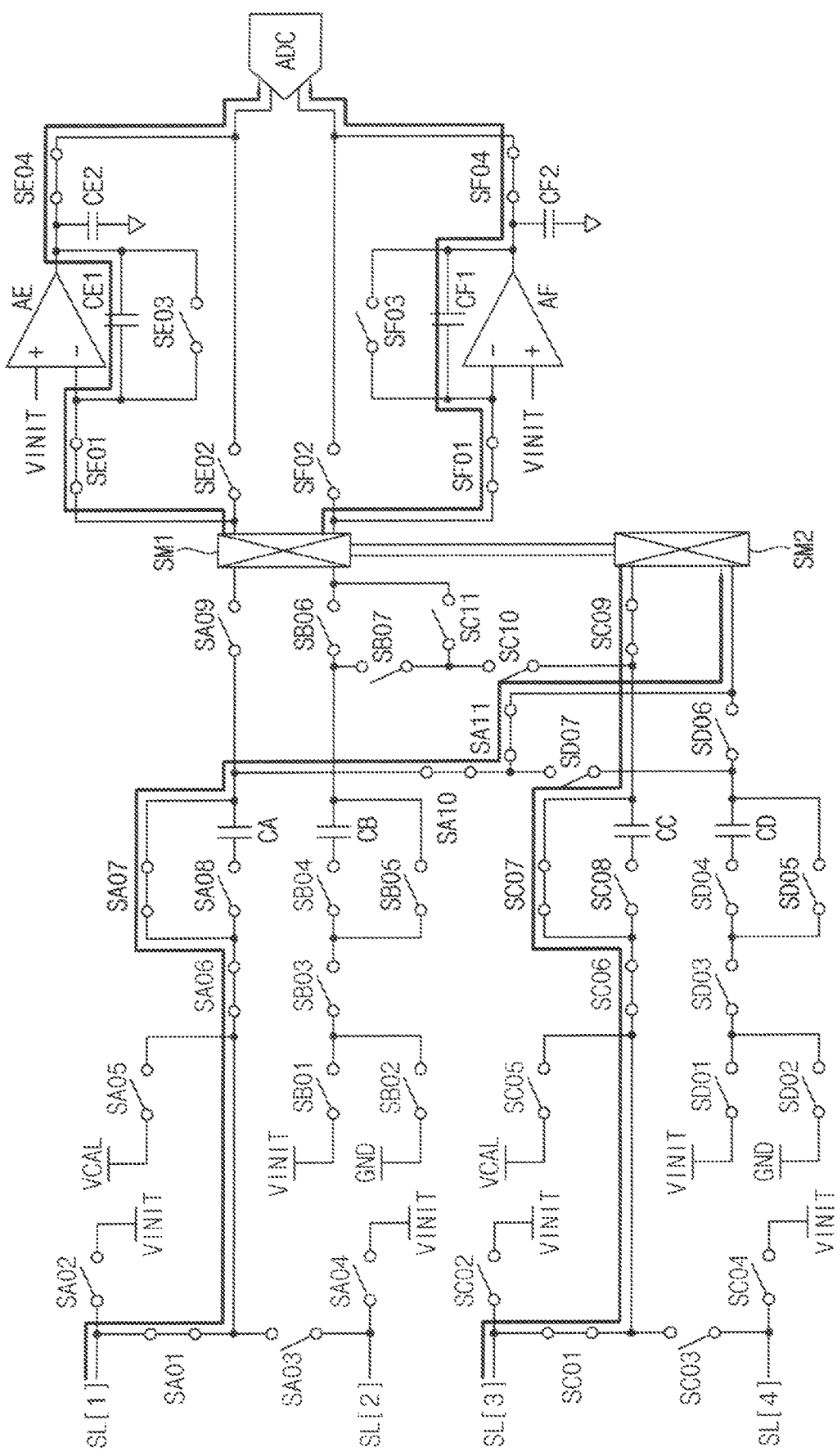
FIG. 12 is a circuit diagram illustrating the sensing circuit of FIG. 5 sensing a sensing signal of the third sensing line in the third mode according to an embodiment of the present inventive concept.
Figure 13:
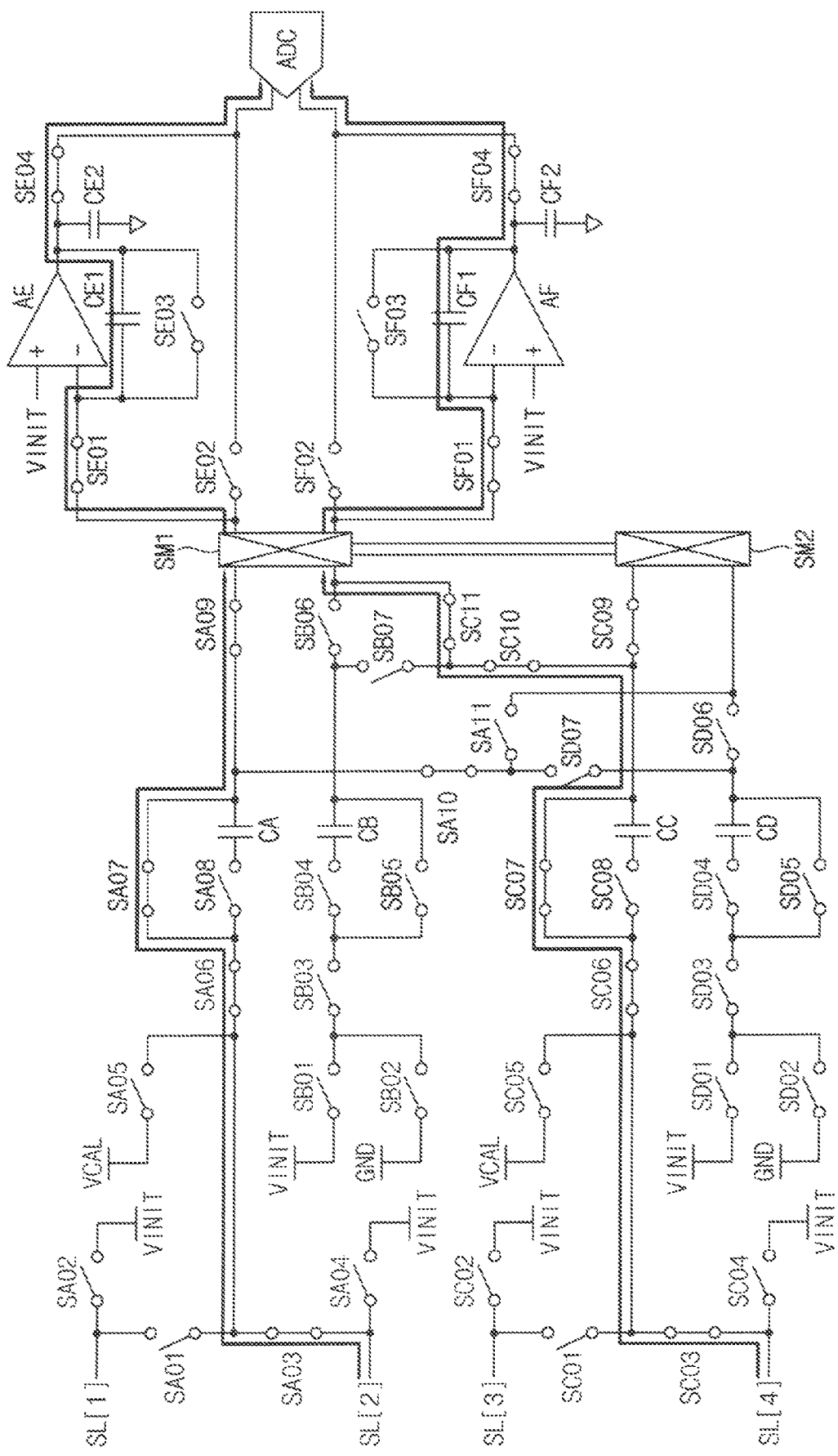
FIG. 13 is a circuit diagram illustrating the sensing circuit of FIG. 5 sensing a sensing signal of the second sensing line in the third mode according to an embodiment of the present inventive concept.

FIG. 11 is a circuit diagram illustrating the sensing circuit of FIG. 5 sensing a sensing signal of the first sensing line in a third mode according to an embodiment of the present inventive concept. FIG. 12 is a circuit diagram illustrating the sensing circuit of FIG. 5 sensing a sensing signal of the third sensing line in the third mode according to an embodiment of the present inventive concept. FIG. 13 is a circuit diagram illustrating the sensing circuit of FIG. 5 sensing a sensing signal of the second sensing line in the third mode according to an embodiment of the present inventive concept.

Referring to FIGS. 11 to 13, the third mode is a "differential sensing mode." In the differential sensing mode, a sensing signal provided from a sensing line is applied to the first input terminal of the analog digital converter ADC through the first common sensing amplifier AE, and another sensing signal provided from another sensing line is applied to the second input terminal of the analog digital converter ADC through the second common sensing amplifier AF.

In FIG. 11, switches SA01, SA06, SA07 and SA09 are turned on so that the signal of the first sensing line SL[1] may be applied to the first input terminal of the first switch matrix SM1.

Switches SC01, SC06, SC07, SC10 and SC11 are turned on so that the signal of the third sensing line SL[3] may be applied to the second input terminal of the first switch matrix SM1.

Switches SE01 and SE04 of the first mode setting circuit are turned on so that the signal of the first sensing line SL[1] is applied to the first input terminal of the analog-to-digital converter ADC through the first common sensing amplifier AE.

Switches SF01 and SF04 of the second mode setting circuit are turned on so that the signal of the third sensing line SL[3] is applied to the second input terminal of the analog-to-digital converter ADC through the second common sensing amplifier AF.

In FIG. 12, switches SC01, SC06, SC07 and SC09 are turned on so that the signal of the third sensing line SL[3] may be applied to the first input terminal of the second switch matrix SM2.

Switches SA01, SA06, SA07, SA10 and SA11 are turned on so that the signal of the first sensing line SL[1] may be applied to the second input terminal of the second switch matrix SM2.

Switches SE01 and SE04 of the first mode setting circuit are turned on so that the signal of the third sensing line SL[3] is applied to the first input terminal of the analog-to-digital converter ADC through the first common sensing amplifier AE.

Switches SF01 and SF04 of the second mode setting circuit are turned on so that signal of the first sensing line SL[1] is applied to the second input terminal of the analog-to-digital converter ADC through the second common sensing amplifier AF.

In FIG. 13, switches SA03, SA06, SA07 and SA09 are turned on so that the signal of the second sensing line SL[2] may be applied to the first input terminal of the first switch matrix SM1.

Switches SC03, SC06, SC07, SC10 and SC11 are turned on so that the signal of the fourth sensing line SL[4] may be applied to the second input terminal of the first switch matrix SM1.

Switches SE01 and SE04 of the first mode setting circuit are turned on so that the signal of the second sensing line SL[2] is applied to the first input terminal of the analog-to-digital converter ADC through the first common sensing amplifier AE.

Switches SF01 and SF04 of the second mode setting circuit are turned on so that the signal of the fourth sensing line SL[4] is applied to the second input terminal of the analog-to-digital converter ADC through the second common sensing amplifier AF.

According to an embodiment of the present inventive concept, the sensing circuit may sense the electrical characteristic of the switching element of the pixel P using the common sensing amplifiers AE and AF disposed in front of (e.g., connected to) the analog-to-digital converter ADC for the plurality of sensing lines. The sensing circuit may use the common sensing amplifiers AE and AF so that a decrease of the sensing accuracy of the electrical characteristic of the switching element of the pixel P due to the deviation of feedback capacitances of the sensing amplifiers may be prevented or reduced. In addition, a decrease of the sensing accuracy of the electrical characteristic of the switching element of the pixel P due to the voltage difference between the input terminals of the sensing amplifiers due to the offsets of the sensing amplifiers may be prevented or reduced.

The sensing circuit may sense the electrical characteristic of the switching element of the pixel P using the common sensing amplifiers AE and AF for the plurality of sensing lines so that the sensing accuracy may be increased. Thus, the accuracy for compensating the electrical characteristic of the switching element of the pixel P may be increased so that the display quality of the display panel 100 may be increased.

Figure 14:
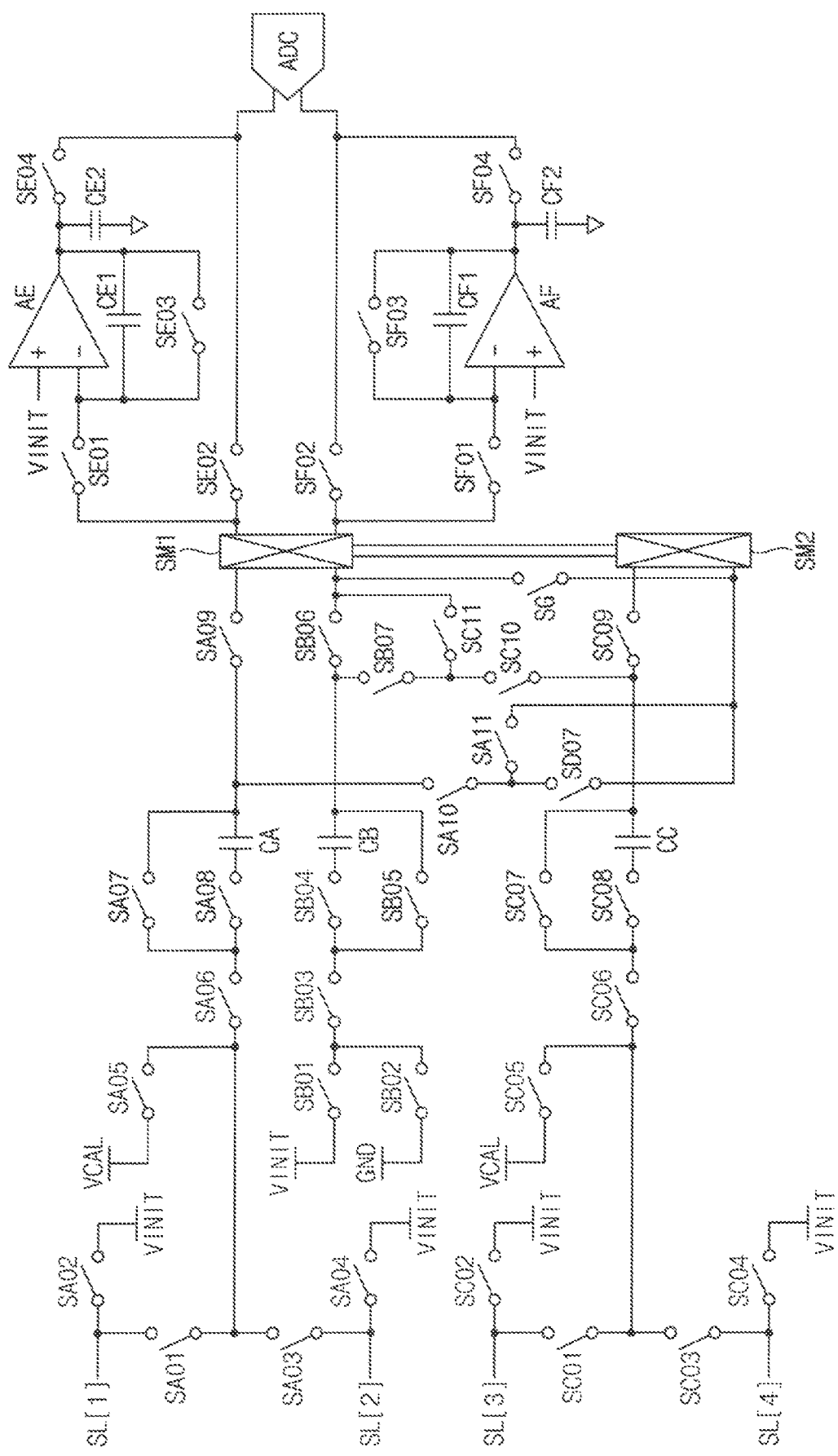
FIG. 14 is a circuit diagram illustrating a sensing circuit of a display apparatus according to an embodiment of the present inventive concept.

FIG. 14 is a circuit diagram illustrating a sensing circuit of a display apparatus according to an embodiment of the present inventive concept.

The sensing circuit and the display apparatus according to an embodiment illustrated in FIG. 14 is substantially the same as the sensing circuit and the display apparatus described with reference to FIGS. 1 to 13, except for the structure of the sensing circuit. Thus, for convenience of explanation, the same reference numerals will be used to refer to the same or like parts as those previously described with reference to FIGS. 1 to 13, and any repetitive explanation concerning the above elements may be omitted.

Referring to FIGS. 1 to 4 and 14, the sensing circuit of FIG. 14 may further include a connecting switch SG connecting the second input terminal of the first switch matrix SM1 and the second input terminal of the second switch matrix SM2.

In an embodiment according to FIG. 14, switches SD01, SD02, SD03, SD04, SD05 and SD06, which may be referred to as a second sensing reference voltage generating circuit in the sensing circuit of FIG. 5, may be excluded.

The sensing circuit of FIG. 14 may provide the sensing reference voltage both to the second input terminal of the first switch matrix SM1 and to the second input terminal of the second switch matrix SM2 using a single sensing reference voltage generating circuit including switches SB01 to SB06. Thus, the number of the sensing reference voltage generating circuits may be reduced.

Referring to a comparative example, a sensing circuit may include a plurality of sensing amplifiers disposed at every sensing line. A sensing accuracy of the electrical characteristic of the switching element of the pixel may be decreased due to a deviation of feedback capacitances of the sensing amplifiers. In addition, when an initialization voltage is applied to the sensing amplifiers, a voltage difference between input terminals of the sensing amplifiers may occur due to offsets of the sensing amplifiers. A sensing accuracy of the electrical characteristic of the switching element of the pixel may be decreased due to the voltage difference between the input terminals of the sensing amplifiers. When the sensing accuracy is decreased, an accuracy for compensating the electrical characteristic of the switching element of the pixel may be decreased, and the display quality of the display panel may be deteriorated.

According to an embodiment of the present inventive concept, the sensing circuit may sense the electrical characteristic of the switching element of the pixel P using the common sensing amplifiers AE and AF disposed in front of (e.g., connected to) the analog-to-digital converter ADC for the plurality of sensing lines. The sensing circuit may use the common sensing amplifiers AE and AF so that the decrease of the sensing accuracy of the electrical characteristic of the switching element of the pixel P due to the deviation of feedback capacitances of the sensing amplifiers may be prevented or reduced. In addition, the decrease of the sensing accuracy of the electrical characteristic of the switching element of the pixel P due to the voltage difference between the input terminals of the sensing amplifiers due to the offsets of the sensing amplifiers may be prevented or reduced.

The sensing circuit may sense the electrical characteristic of the switching element of the pixel P using the common sensing amplifiers AE and AF for the plurality of sensing lines so that the sensing accuracy may be increased. Thus, the accuracy for compensating the electrical characteristic of the switching element of the pixel P may be increased so that the display quality of the display panel 100 may be increased.

In addition, the number of the sensing reference voltage generating circuits may be reduced so that the sensing circuit may be simplified.

As is traditional in the field of the present inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

According to embodiments of the sensing circuit and the display apparatus, a sensing error may be reduced so that the display quality of the display panel may be increased.

While the present inventive concept has been particularly shown and described with reference to the embodiments thereof, it will be understood by those of ordinary skill in the art that various changes in form and detail may be made therein without departing from the spirit and scope of the present inventive concept as defined by the following claims.

What is claimed is:

1. A sensing circuit, comprising:
a first input selecting circuit connected to a first sensing line and a second sensing line;
a first path setting circuit configured to set a path of a first sensing signal received from the first sensing line or a path of a second sensing signal received from the second sensing line;
a second path setting circuit configured to set a path of a first sensing reference voltage;
a first switch matrix connected to the first path setting circuit and the second path setting circuit;
a first mode setting circuit connected to a first output terminal of the first switch matrix;
a first common sensing amplifier connected to the first mode setting circuit;
a second mode setting circuit connected to a second output terminal of the first switch matrix; and
a second common sensing amplifier connected to the second mode setting circuit.

2. The sensing circuit of claim 1, further comprising:
an analog-to-digital converter connected to an output terminal of the first common sensing amplifier and an output terminal of the second common sensing amplifier.

3. The sensing circuit of claim 2, wherein the first mode setting circuit comprises:
a first mode setting switch connected between the first output terminal of the first switch matrix and a first input terminal of the first common sensing amplifier; and
a second mode setting switch connected between the first output terminal of the first switch matrix and a first input terminal of the analog-to-digital converter.

4. The sensing circuit of claim 3, further comprising:
a first amplifier capacitor; and
a first amplifier switch,
wherein each of the first amplifier capacitor and the first amplifier switch is connected between the first input terminal of the first common sensing amplifier and the output terminal of the first common sensing amplifier,
wherein the first amplifier capacitor and the first amplifier switch are connected to each other in parallel.

5. The sensing circuit of claim 2, wherein the second mode setting circuit comprises:
a first mode setting switch connected between the second output terminal of the first switch matrix and an input terminal of the analog-to-digital converter; and
a second mode setting switch connected between the second output terminal of the first switch matrix and a first input terminal of the second common sensing amplifier.

6. The sensing circuit of claim 5, further comprising:
an amplifier capacitor; and
an amplifier switch,
wherein each of the amplifier capacitor and the amplifier switch is connected between the first input terminal of the second common sensing amplifier and the output terminal of the second common sensing amplifier,
wherein the amplifier capacitor and the amplifier switch are connected to each other in parallel.

7. The sensing circuit of claim 1, further comprising:
a second input selecting circuit connected to a third sensing line and a fourth sensing line;
a third path setting circuit configured to set a path of a third sensing signal received from the third sensing line or a path of a fourth sensing signal received from the fourth sensing line;
a fourth path setting circuit configured to set a path of the first sensing reference voltage; and
a second switch matrix connected to the third path setting circuit, the fourth path setting circuit, and the first switch matrix.

8. The sensing circuit of claim 7, further comprising:
a first channel switching circuit connecting the first path setting circuit and the fourth path setting circuit.

9. The sensing circuit of claim 8, wherein the first channel switching circuit comprises:
a first channel switching switch connected between the first path setting circuit and a first channel switching node;
a second channel switching switch connected between a first node of the fourth path setting circuit and the first channel switching node; and
a third channel switching switch connected between a second node of the fourth path setting circuit and the first channel switching node.

10. The sensing circuit of claim 7, further comprising:
a channel switching circuit connecting the second path setting circuit and the third path setting circuit.

11. The sensing circuit of claim 10, wherein the channel switching circuit comprises:
a first channel switching switch connected between a first node of the second path setting circuit and a channel switching node;
a second channel switching switch connected between a second node of the second path setting circuit and the channel switching node; and
a third channel switching switch connected between the third path setting circuit and the channel switching node.

12. The sensing circuit of claim 1,
wherein the second path setting circuit comprises a first path setting switch, a second path setting switch, a third path setting switch, a fourth path setting switch, and a first capacitor,
wherein the first path setting switch is connected between a sensing reference voltage input node configured to receive the first sensing reference voltage and the second path setting switch,
wherein the second path setting switch is connected between the first path setting switch and the first capacitor,
wherein the third path setting switch is connected between the first path setting switch and the fourth path setting switch, and
wherein the fourth path setting switch is connected between the first capacitor and the first switch matrix.

13. The sensing circuit of claim 12, further comprising:
a first voltage selecting circuit configured to provide the first sensing reference voltage to the second path setting circuit,
wherein the first voltage selecting circuit comprises:
a first voltage selecting switch including a first end configured to receive a second sensing reference voltage and a second end connected to the first path setting switch; and a second voltage selecting switch including a first end configured to receive a third sensing reference voltage and a second end connected to the first path setting switch.

14. The sensing circuit of claim 1, wherein the first input selecting circuit comprises:
a first input selecting switch connected between the first sensing line and a first input node;
a second input selecting switch connected between the first sensing line and an initialization terminal;
a third input selecting switch connected between the second sensing line and the first input node; and
a fourth input selecting switch connected between the second sensing line and the initialization terminal.

15. The sensing circuit of claim 1,
wherein the first path setting circuit comprises a first path setting switch, a second path setting switch, a third path setting switch, a fourth path setting switch, and a first capacitor,
wherein the first path setting switch is connected between a first input node and the third path setting switch,
wherein the second path setting switch is connected between the first path setting switch and the fourth path setting switch,
wherein the third path setting switch is connected between the first path setting switch and the first capacitor, and
wherein the fourth path setting switch is connected between the first capacitor and the first switch matrix.

16. The sensing circuit of claim 1, further comprising:
a first calibration circuit connected to the first input selecting circuit,
wherein the first calibration circuit is configured to output a calibration voltage to a first input node.

17. A display apparatus, comprising:
a display panel configured to display an image based on input image data, and comprising a plurality of data lines, a plurality of sensing lines, and a plurality of pixels connected to the plurality of data lines and the plurality of sensing lines; and
a readout chip configured to receive a sensing signal through at least one of the plurality of sensing lines, and to output a data voltage compensated based on the sensing signal to at least one of the plurality of data lines,
wherein the readout chip comprises:
a first input selecting circuit connected to a first sensing pad and a second sensing pad;
a first path setting circuit configured to set a path of a first sensing signal received from the first sensing pad or a path of a second sensing signal received from the second sensing pad;
a second path setting circuit configured to set a path of a sensing reference voltage;
a first switch matrix connected to the first path setting circuit and the second path setting circuit;
a first mode setting circuit connected to a first output terminal of the first switch matrix;
a first common sensing amplifier connected to the first mode setting circuit;
a second mode setting circuit connected to a second output terminal of the first switch matrix; and
a second common sensing amplifier connected to the second mode setting circuit.

18. The display apparatus of claim 17, wherein, in a single sensing mode, the first sensing signal of the first sensing pad is applied to a first input terminal of an analog-to-digital converter through the first common sensing amplifier, and the sensing reference voltage is applied to a second input terminal of the analog-to-digital converter.

19. The display apparatus of claim 17, wherein, in a differential sensing mode, the first sensing signal of the first sensing pad is applied to a first input terminal of an analog-to-digital converter through the first common sensing amplifier, and a third sensing signal of a third sensing pad is applied to a second input terminal of the analog-to-digital converter through the second common sensing amplifier.

20. The display apparatus of claim 17, wherein, in a without amplifier mode, the first sensing signal of the first sensing pad is applied to a first input terminal of an analog-to-digital converter through a first path that does not pass through the first common sensing amplifier in the first mode setting circuit, and the sensing reference voltage is applied to a second input terminal of the analog-to-digital converter through a second path that does not pass through the second common sensing amplifier in the second mode setting circuit.

\* \* \* \* \*